(12) United States Patent
Nakayama

(10) Patent No.: US 7,902,743 B2
(45) Date of Patent: Mar. 8, 2011

(54) ORGANIC ELECTROLUMINESCENT DISPLAY DEVICE AND METHOD FOR PRODUCING THE SAME

(75) Inventor: Masaya Nakayama, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 627 days.

(21) Appl. No.: 11/892,390

(22) Filed: Aug. 22, 2007

(65) Prior Publication Data
US 2008/0074041 A1 Mar. 27, 2008

(30) Foreign Application Priority Data
Sep. 25, 2006 (JP) .................. 2006-259564

(51) Int. Cl.
*H01L 51/50* (2006.01)
(52) U.S. Cl. ......................... 313/504; 313/512
(58) Field of Classification Search .................. 313/504, 313/512
See application file for complete search history.

(56) References Cited

U.S. PATENT DOCUMENTS

| | | | |
|---|---|---|---|
| 6,320,312 B1 * | 11/2001 | Kim et al. ...................... | 313/506 |
| 2003/0098647 A1 * | 5/2003 | Silvernail et al. ............. | 313/506 |
| 2004/0115859 A1 * | 6/2004 | Murayama et al. ............ | 438/99 |

FOREIGN PATENT DOCUMENTS

| | | |
|---|---|---|
| JP | 2004-103582 A | 4/2004 |
| JP | 2005-203196 A | 7/2005 |
| JP | 2005-235491 A | 9/2005 |
| JP | 2005-267991 A | 9/2005 |

* cited by examiner

*Primary Examiner* — Toan Ton
*Assistant Examiner* — Hana S Featherly
(74) *Attorney, Agent, or Firm* — Birch, Stewart, Kolasch & Birch, LLP

(57) ABSTRACT

An organic electroluminescent display device includes a substrate, lower electrodes arranged in stripes on the substrate, an insulating layer arranged on the lower electrodes, upper transparent electrodes arranged in stripes in a direction intersecting with the lower electrodes, an organic electroluminescent layer arranged between the lower electrodes and the upper transparent electrodes, electrodes auxiliary to the upper electrodes arranged on the insulating layer and connected with the upper transparent electrodes, and insulating barrier walls arranged on the insulating layer or the electrodes auxiliary to the upper electrodes, the widths of which are broadened in the upper portions, wherein the upper electrodes are connected to the electrodes auxiliary to the upper electrodes at a position between the insulating layer and a region where the width of the insulating barrier wall is broadest, and are connected within a region corresponding to the broadest width of the insulating barrier wall; and a method for producing the device.

7 Claims, 11 Drawing Sheets

EMITTING LIGHT

A-A' CROSS-SECTION

ORGANIC ELECTROLUMINESCENT DISPLAY DEVICE AND METHOD FOR PRODUCING THE SAME

CROSS-REFERENCE TO RELATED APPLICATION

This application claims priority under 35 USC 119 from Japanese Patent Application No. 2006-259564, the disclosure of which is incorporated by reference herein.

BACKGROUND OF THE INVENTION

1. Technical Field

The present invention relates to an organic electroluminescent (EL) display device and a method for producing the same.

2. Description of the Related Art

There have been recent advancements in the development of organic electroluminescent (EL) display devices as thin type display devices.

FIG. 9 schematically shows one example of the constitution of a display panel of an organic EL display device. In an organic EL display panel 30, an organic EL element is formed on a substrate 31, and the EL element includes an anode (lower electrode) 32, a hole transportation layer 33, a light emitting layer 34, an electron transportation layer 35, a cathode (upper electrode) 36, and a protective layer (sealing member) 37 is also provided in order to prevent degradation of the organic EL element due to oxygen, moisture and the like.

When producing an organic EL display device provided with the organic EL display panel 30 having the above-described structure, the following steps may be carried out.

On a substrate 31 made of a transparent material such as glass, a transparent anode (extraction electrode) 32 made of ITO or the like is formed through vacuum deposition, and, subsequently, an insulating layer and barrier wall (not shown) are formed. Then, by using a shadow mask, the hole transportation layer 33, the light emitting layer 34, the electron transportation layer 35 and the like are sequentially formed in a predetermined position through vacuum deposition (mask deposition), followed by film formation of the cathode 36 made from Al, MgAg or the like. Incidentally, the organic EL layer 38 is not limited to the configuration shown in FIG. 9, but may have various configurations, including, for example, a configuration having no transportation layers 33 and 35, or having an injection layer between electrodes 32 and 36 and transportation layers 33 and 35, or having a so-called multiphoton emission element in which light emitting layers and the like are laminated in series.

By selectively applying a voltage between the lower electrode (anode) 32 and the upper electrode (cathode) 36, the light emitting layer 34 emits light, and the light from the light emitting layer 34 is made to leave the transparent substrate 31 via the anode 32. Display panels in which the light from the light emitting layer 34 is made to leave from the transparent substrate 31 side in this way are referred to as "bottom emission" panels.

Contrastingly, organic EL display panels having a so-called "top-emission" structure, in which a transparent electrode is used as an upper electrode and the light is made to leave from the upper electrode side, have been also developed.

In transparent organic EL display panels, and organic EL display panels having a top-emission structure or the like, when a transparent electrode material such as ITO or the like is used for an upper electrode or upper electrode wiring, since such a transparent electrode material has a high resistivity, the voltage at the cathode wiring portion decreases by a large amount, and the element cannot be supplied with sufficient voltage, and as a consequence the brightness of the panel decreases. Known methods for overcoming this problem include methods such as forming an auxiliary electrode to be connected to the upper electrode (for example, see Japanese Patent Application Laid-Open (JP-A) Nos. 2005-203196, 2005-235491, and 2005-267991).

FIG. 10 shows one example of the configuration of an organic EL display panel of the related art that is provided with an auxiliary electrode, and FIG. 11 schematically shows the A-A' cross-section of an organic EL display panel 70. In FIGS. 10 and 11, components with the same symbols indicate the same components. In the organic EL display panel 70, after sequentially forming a lower electrode 72 and an insulating layer 77 on a substrate 71, an auxiliary electrode 74 for the upper electrode is formed so as to protrude toward the inside of an emitting region at one corner thereof. Then, an insulating barrier wall 76, an organic EL layer 73, and an upper electrode 75 are formed sequentially, wherein the portion 74a of the auxiliary electrode 74 which protrudes toward the inside of the emitting region, and the upper electrode 75 are connected to each other (see JP-A No. 2004-103582).

However, there are problems when using a structure wherein a part of an auxiliary electrode is formed so as to protrude towards the inside of the emitting region as described above; namely, for example, the openings become narrower, the effective pixel regions become smaller, and more complex production processes are required.

SUMMARY OF THE INVENTION

According to an aspect of the invention, there is provided an organic electroluminescent (EL) display device comprising: a substrate, lower electrodes arranged in stripes on the substrate; an insulating layer arranged on the lower electrodes, upper transparent electrodes arranged in stripes in a direction intersecting with the lower electrodes; an organic EL layer arranged between the lower electrodes and the upper transparent electrodes; electrodes auxiliary to the upper electrodes arranged on the insulating layer and connected with the upper transparent electrodes; and insulating barrier walls arranged on the insulating layer or the electrodes auxiliary to the upper electrodes, the width of the insulating barrier walls being broadened toward upper portions thereof; wherein the upper electrodes are connected to the electrodes auxiliary to the upper electrodes at a position between the insulating layer and a region where the widths of the insulating barrier walls are broadest, and are connected writing the region corresponding to the broadest width of the insulating barrier wall.

According to another aspect of the invention, there is provided a method for producing an organic EL display device of an aspect of the invention, comprising sequentially forming the lower electrodes, the insulating layer, the electrodes auxiliary to the upper electrodes, the insulating barrier walls, the organic EL layer, and the upper transparent electrodes, wherein the upper transparent electrodes are formed by a sputtering method.

DETAILED DESCRIPTION OF THE INVENTION

Hereinafter, the organic electroluminescent (EL) display device according to the present invention is described in detail with reference to the attached drawings. In FIGS. 1 to 9, components having the same symbol indicate the same components, and the descriptions thereof are omitted.

Figure 1A:
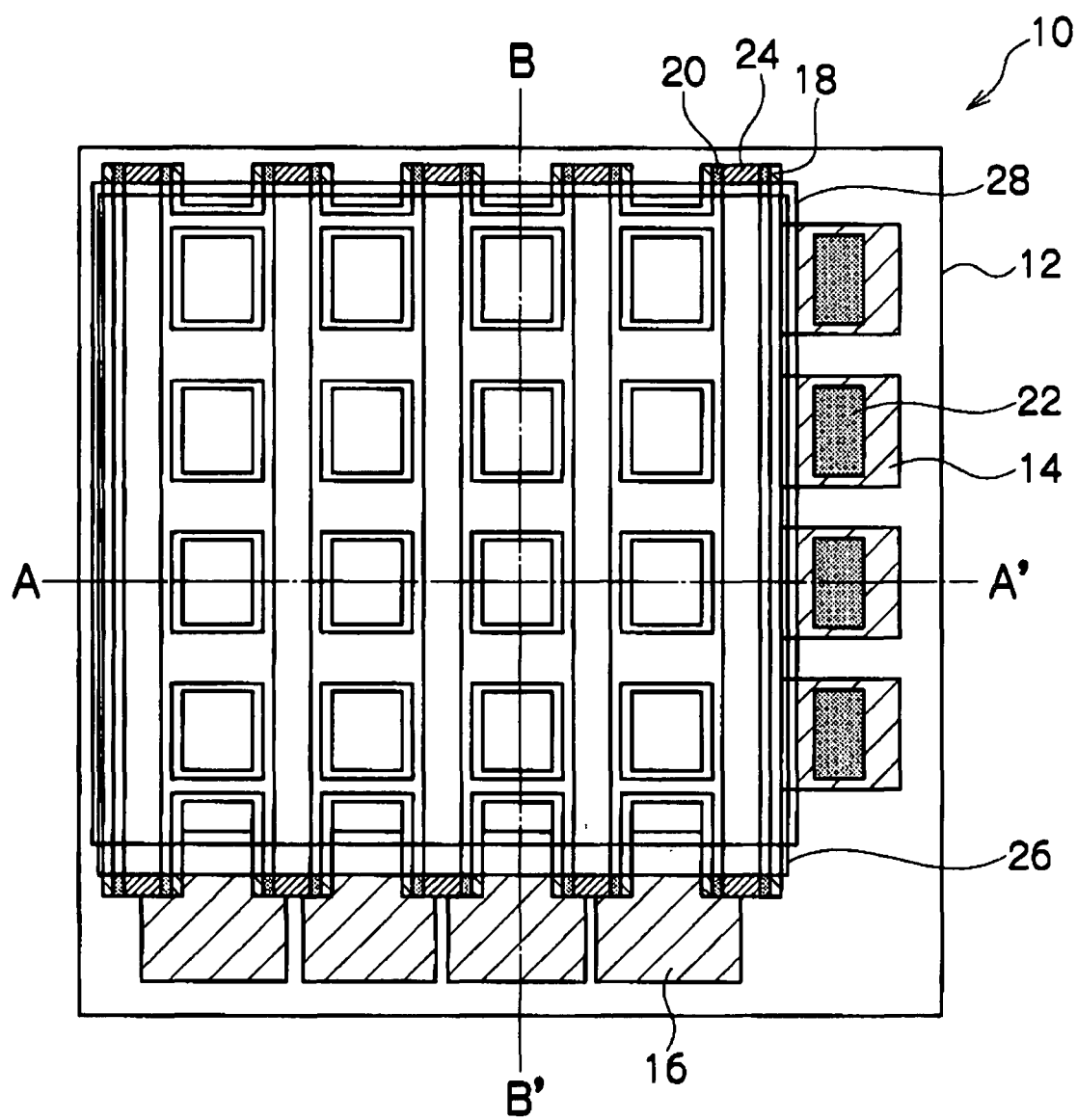
FIG. 1A is a schematic plan view showing an example of a panel which is the main part of the organic electroluminescent (EL) display device according to the present invention.
Figure 1B:
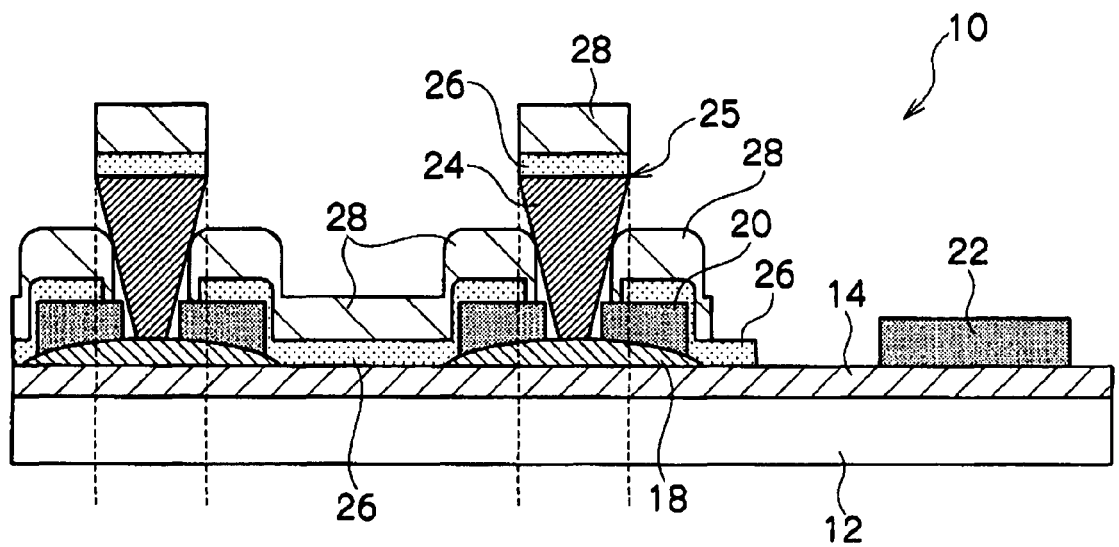
FIG. 1B is a partial cross-sectional view along the A-A' line of the panel as shown in FIG. 1A.
Figure 1C:
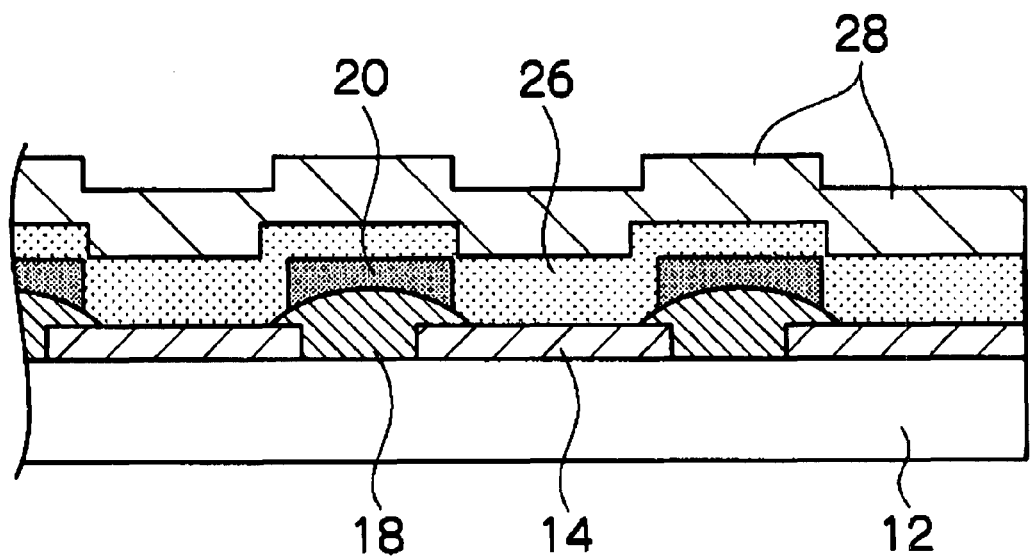
FIG. 1C is a partial cross-sectional view along the B-B' line of the panel as shown in FIG. 1A.

FIGS. 1A, 1B and 1C schematically show an example of the organic EL display panel of the organic EL display device according to an aspect of the invention. As shown in FIG. 1B, in an organic EL display panel 10 according to an aspect of the invention, the width of an insulating barrier wall 24 is broadened at an upper portion thereof. Further, an upper electrode 28 and an auxiliary electrode 20 for the upper electrode 28 are connected to each other at a position between an insulating layer 18, and a region 25 where the width of the insulating barrier wall 24 is broadest, and are connected within the region 25 corresponding to the broadest width of the insulating barrier wall 24 (i.e. connected nearer to the center portion of the insulating barrier wall 24 than the boundaries of the region 25). An organic EL display panel 10 according to an aspect of the invention as described above, as well as a method for producing the same, are described below.

<Substrate>

Figure 2A:
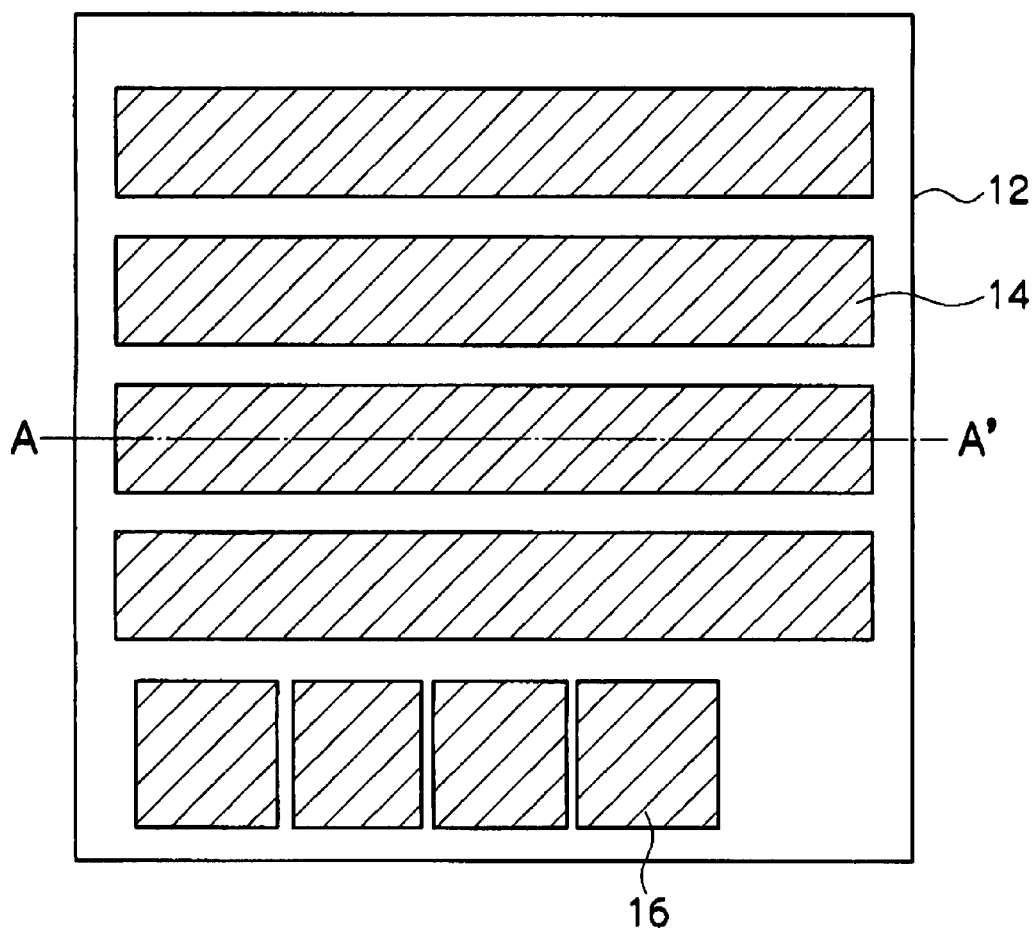
FIG. 2A is a schematic plan view showing an example of the arrangement of the lower electrode (anode).
Figure 2B:
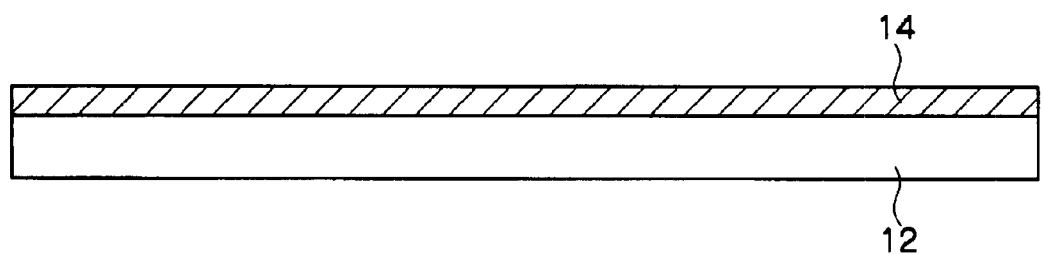
FIG. 2B is a partial cross-sectional view along the A-A' line of the panel as shown in FIG. 2A.

Firstly, on a substrate 12, lower electrodes (anode) 14 are formed in stripes. FIGS. 2A and 2B show an example of the pattern of lower electrodes 14 formed in stripes on the substrate 12.

For the substrate 12, such a transparent substrate as glass or resin can be employed. For example, such a resin substrate as polyester such as polyethylene terephthalate, polybutylene phthalate and polyethylene naphthalate, polystyrene, polycarbonate, polyether sulfone, polyarylate, polyimide, polycycloolefin, norbornene resin, and poly(chlorotrifluoroethylene) can be used favorably.

In case where an organic EL display device having a top-emission structure is to be produced, a non-transparent substrate composed of metal can be employed because there is no necessity for taking out the emitting light from the substrate side. For example, when such a metal substrate as stainless steel, Fe, Al, Ni, Co, Cu or an alloy thereof is used, then a substrate having high gas barrier properties can be obtained. Here, when such a metal substrate is used, an insulating film for assuring electrical insulation properties may be provided between the substrate 12 and the lower electrode 14.

<Lower Electrode>

For the lower electrode 14 to be formed on the substrate 12, a publicly known material for constituting the anode of an organic EL element, including, for example, such electroconductive metal oxides as tin oxides doped with antimony or fluorine (ATO, FTO), tin oxide, zinc oxide, indium oxide, indium tin oxide (ITO), indium zinc oxide (IZO), and zinc oxides doped with aluminum or gallium (AZO, GZO) can be used favorably. Incidentally, when an organic EL display device of a top-emission type is to be produced, the lower electrode 14 need not be transparent, but when an organic EL display device equipped with a transparent organic EL display panel 10 is to be produced, it is necessary to employ a transparent electrode as the lower electrode 14, and ITO is preferred from the viewpoints of electroconductivity, transparency etc.

For a method for forming lower electrodes (anode) 14 in stripes on the substrate 12, a photolithographic process can be employed for forming them in an intended pattern. The same material as that for the lower electrode 14 may be used for simultaneously forming an extraction wiring 16 for the upper electrode (cathode).

The thickness of the lower electrode (anode) 14 is not particularly limited, but it may be formed within a range, for example, of around 10 nm to 1 μm, in particular 50 nm to 200 nm. The anode 14 having such thickness can sufficiently function as the anode 14 of organic EL elements and, at the same time, can give a sufficiently high transmittance for visible light.

<Insulating Layer>

Figure 3A:
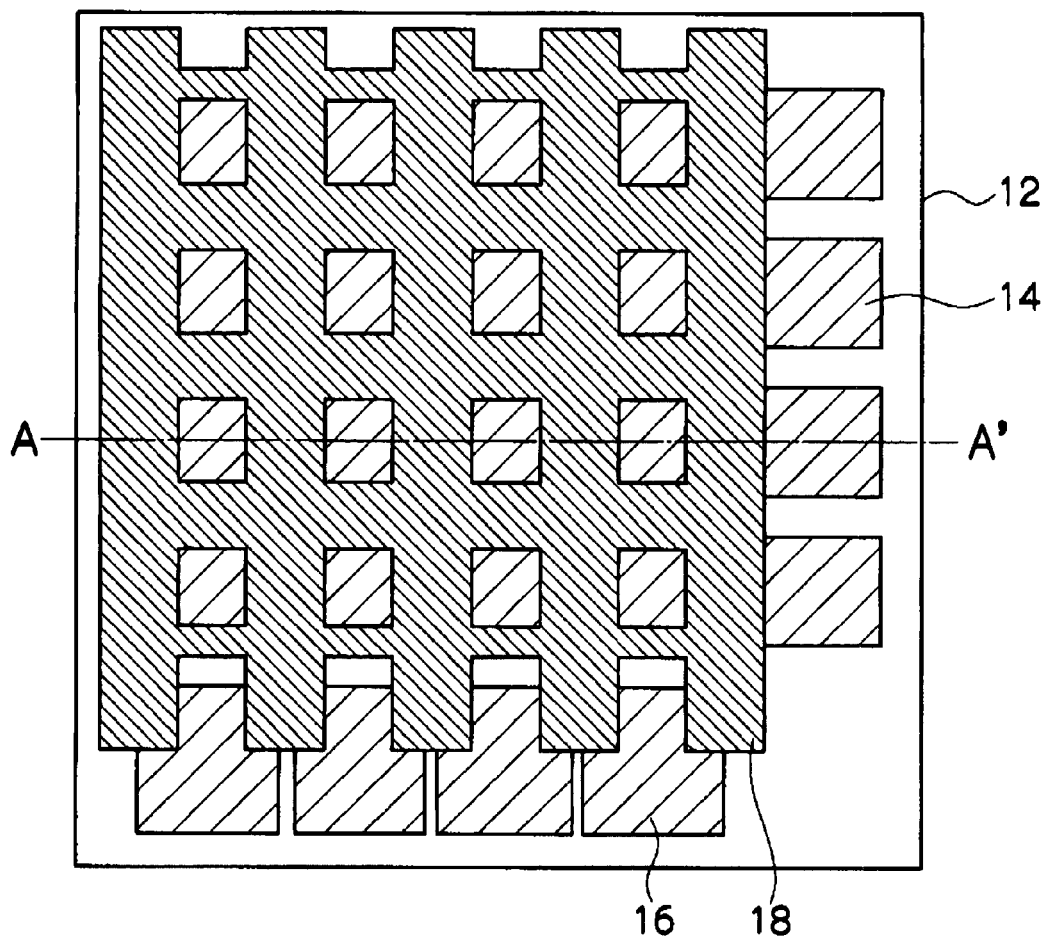
FIG. 3A is a schematic plan view showing an example of the arrangement of the insulating layer.
Figure 3B:
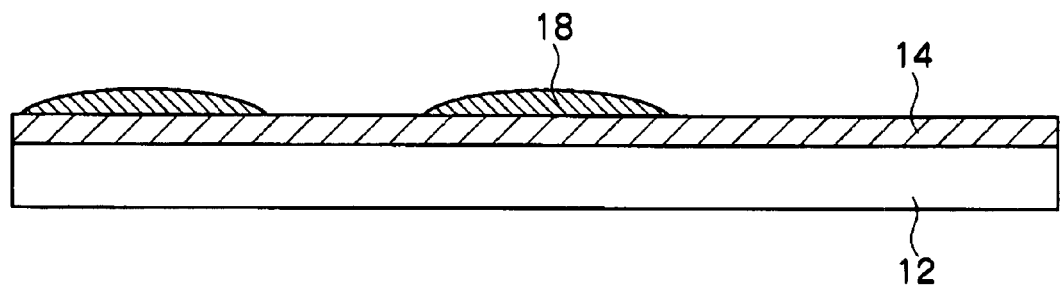
FIG. 3B is a partial cross-sectional view along the A-A' line of the panel as shown in FIG. 3A.

After forming the lower electrode 14, the insulating layer 18 is formed. FIGS. 3A and 3B show an example of the arrangement pattern of the insulating layer 18.

For the material for forming the insulating layer 18, publicly known insulating materials can be employed, including, for example, acrylic resin, polyimide resin and amorphous fluorine-containing resin. In case where an organic EL display device equipped with a transmissive organic EL display panel is to be produced, a material having optical transmission properties for visible light is used. For a method for forming the insulating layer 18, such insulating material as described above may be coated on the substrate 12 to be formed into an intended pattern by means of photolithography. For the insulating layer 18, an inorganic film may be also employed. For the inorganic film to be used at that time, for example, such an oxide film or nitride film as silicon oxide SiOx, silicon nitride SiNx, tantalum oxide TaOx, or tantalum nitride TaNx can be mentioned. For forming an inorganic film, a film is formed by using vacuum deposition through a sputtering method or a CVD method, thereafter photolithography is employed for patterning, and then the film is etched to form the insulating layer 18 in an intended pattern. In this connection, in an aspect of the invention, the upper electrode 28 and the auxiliary electrode 20 for the upper electrode, which are formed later, are connected with each other at a position between the portion 25 where the width of the insulating barrier wall 24 is broadest and the insulating layer 18, and inside the portion 25 where the width of the insulating barrier wall 24 is broadest. Therefore, the insulating layer 18 can be formed with a relatively narrow width. By forming the insulating layer 18 with a narrow width, it is possible to make the opening ratio high.

The thickness of the insulating layer 18 is not particularly limited, but it may be formed within a range, for example, of around 100 nm to 10 μm, in particular 200 nm to 2 μm.

<Auxiliary Electrode for Upper Electrode>

Figure 4A:
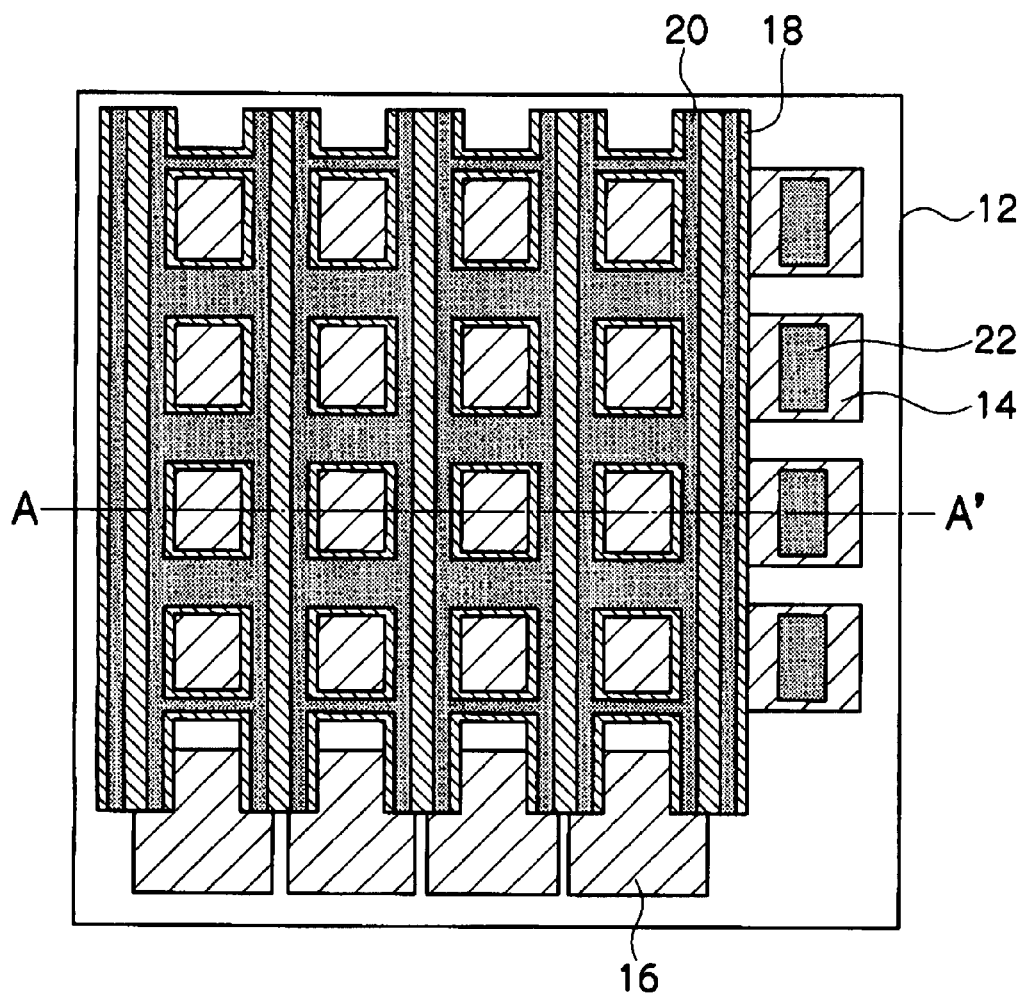
FIG. 4A is a schematic plan view showing an example of the arrangement of the electrode auxiliary to the upper electrode.
Figure 4B:
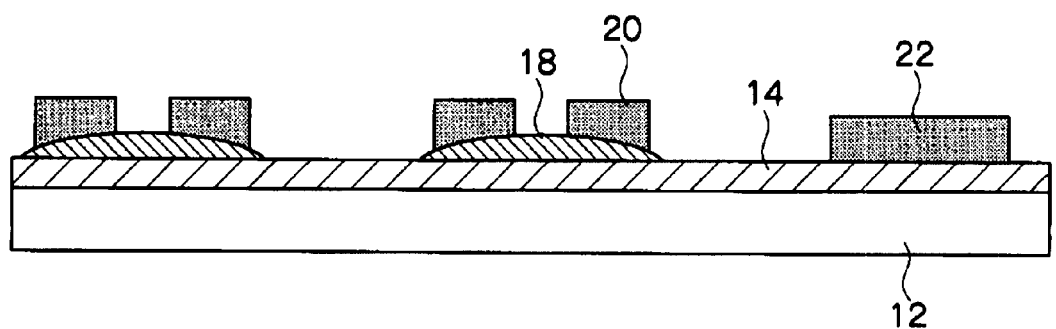
FIG. 4B is a partial cross-sectional view along the A-A' line of the panel as shown in FIG. 4A.

After forming the insulating layer 18, the auxiliary electrode 20 for the upper electrode is formed on the insulating layer 18. FIGS. 4A and 4B show an example of the arrangement pattern of the auxiliary electrode 20 for the upper electrode.

The auxiliary electrode 20 for the upper electrode may be formed of a material having a lower resistivity than the upper transparent electrode 28 described later. When the upper transparent electrode 28 is formed of ITO, the material for the auxiliary electrode 20 is preferably one containing at least one of Mo, Cr and Ti from the viewpoint of the contacting properties with ITO. By etching the material after the patterning through photolithography, the auxiliary electrode 20 for the upper electrode having an intended pattern can be formed on the insulating layer 18. In an aspect of the invention, the auxiliary electrode 20 for the upper electrode and the upper transparent electrode 28 to be formed later are connected with each other at the position inside the portion 25 where the width of the insulating barrier wall 24 is broadest, therefore it is possible to form the auxiliary electrode 20 for the upper electrode with a relatively narrow width. In addition, as shown in FIG. 4A for example, by forming the auxiliary electrodes 20 for the upper electrode so that they are separated by the insulating barrier wall 24 to be formed later therebetween, it is possible to prevent the short circuit between upper electrodes via the auxiliary electrode 20.

The thickness of the auxiliary electrode 20 for the upper electrode may be within a range of 50 nm to 5 μm, preferably 50 nm to 500 nm, although it depends on the height of the insulating barrier wall 24, and the thickness of the organic EL layer 26 and the upper electrode 28.

When forming the auxiliary electrode 20 for the upper electrode, it is also possible to simultaneously forming the auxiliary electrode 22 for the lower electrode connected to the lower electrode 14, or an extraction electrode 22 for transmitting the signal from an external driving circuit to the lower electrode 14 and the upper transparent electrode 28. The auxiliary electrode 20 for the upper electrode, and the auxiliary electrode 22 for the lower electrode or the extraction electrode 22 can be formed simultaneously with the same material to allow the process to be simplified.

<Insulating Barrier Wall>

Figure 5A:
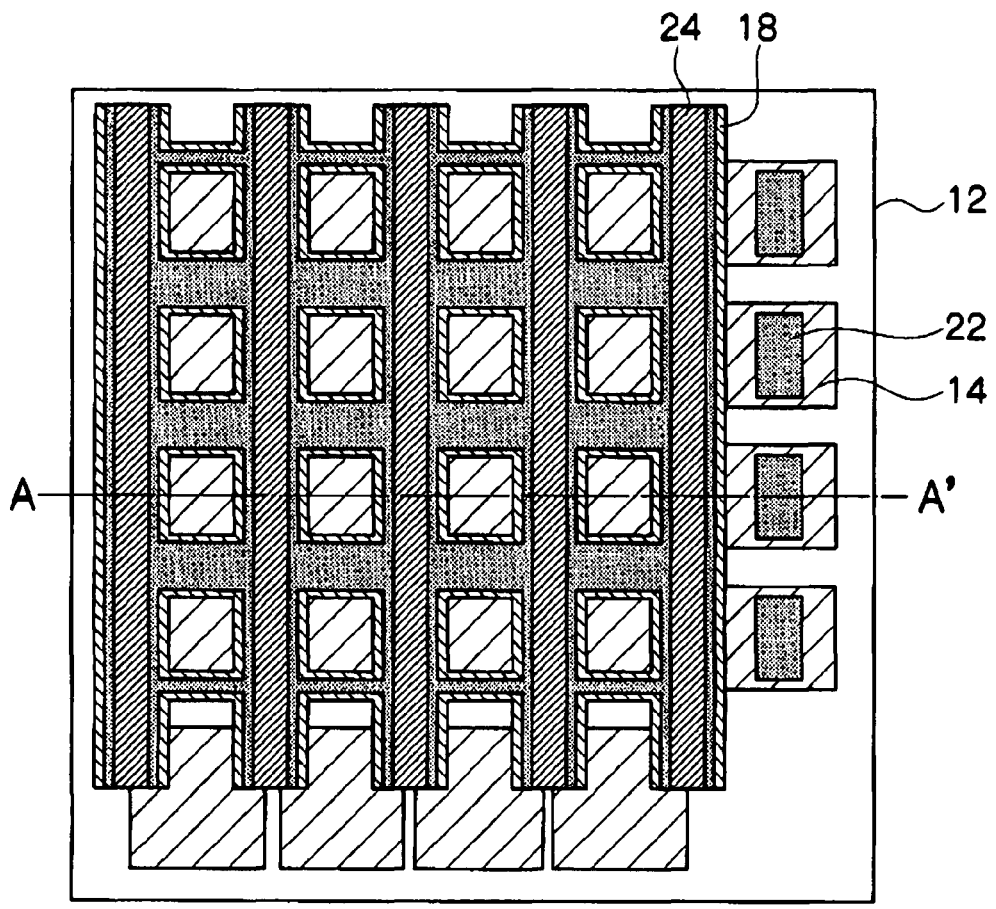
FIG. 5A is a schematic plan view showing an example of the arrangement of the insulating barrier wall.
Figure 5B:
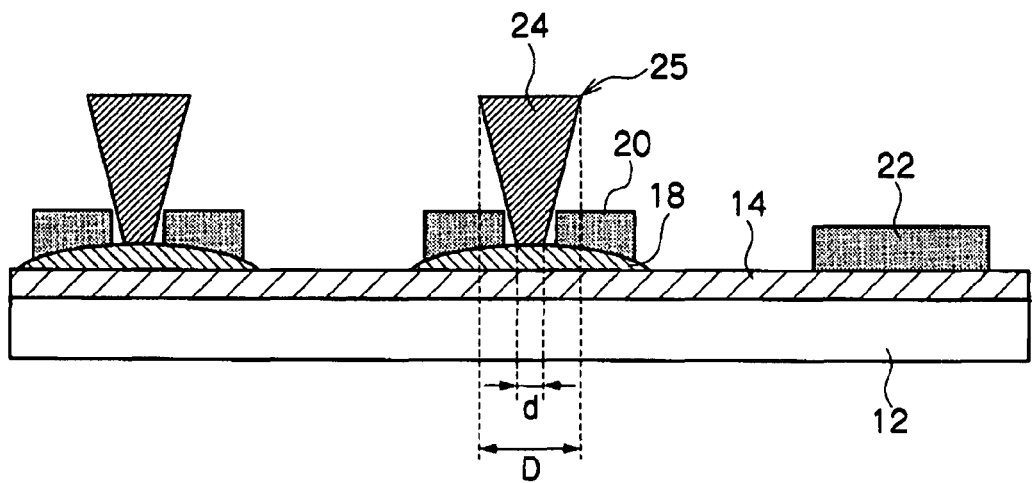
FIG. 5B is a partial cross-sectional view along the A-A' line of the panel as shown in FIG. 5A.

After forming the auxiliary electrode 20 for the upper electrode, the insulating barrier wall 24 is formed. FIGS. 5A and 5B show an example of the arrangement pattern of the insulating barrier wall 24.

As shown in FIG. 5B, the insulating barrier wall 24 is so formed that the width thereof is broadened in the upper portion, and that the portion 25 where the width is broadest lies above the auxiliary electrode 20 for the upper electrode. The insulating barrier wall 24 can be formed by using a publicly known photosensitive resin and being patterned through photolithography, and removing insoluble portions through etching. This can results in forming the insulating barrier wall 24 having an inversely tapered shape. In case where a positive type photosensitive resin is used for the insulating barrier wall 24, by controlling exposure conditions, an inversely tapered shape can be obtained without carrying out etching. Here, as shown in FIG. 5B, by forming the insulating barrier wall 24 so as to separate two auxiliary electrodes 20 for the upper electrode, it is possible to prevent the short circuit between upper electrodes (cathode) 28 via the auxiliary electrode 20, as described above.

The height of the insulating barrier wall 24 is not particularly limited, but when it is in a range of around 0.2 μm to 100 μm, preferably around 1 μm to 8 μm, more preferably around 2 μm to 6 μm, then it is possible to easily form the wall and, in addition, make the difference between the width d at the bottom of the insulating barrier wall 24 and the width D at the uppermost portion thereof comparatively great, to lead to easily assure the connection between the upper electrode 28 described later and the auxiliary electrode 20 for the upper electrode. In this connection, in order to easily assure the connection between the upper electrode 28 and the auxiliary electrode 20 for the upper electrode, it is preferred to form the insulating barrier wall 24 so that the difference between the width d at the bottom of the insulating barrier wall 24 and the width D at the uppermost portion thereof is 1 μm to 50 μm, preferably 2 μm to 20 μm, more preferably 5 μm to 10 μm.

<Organic EL Layer>

Figure 6A:
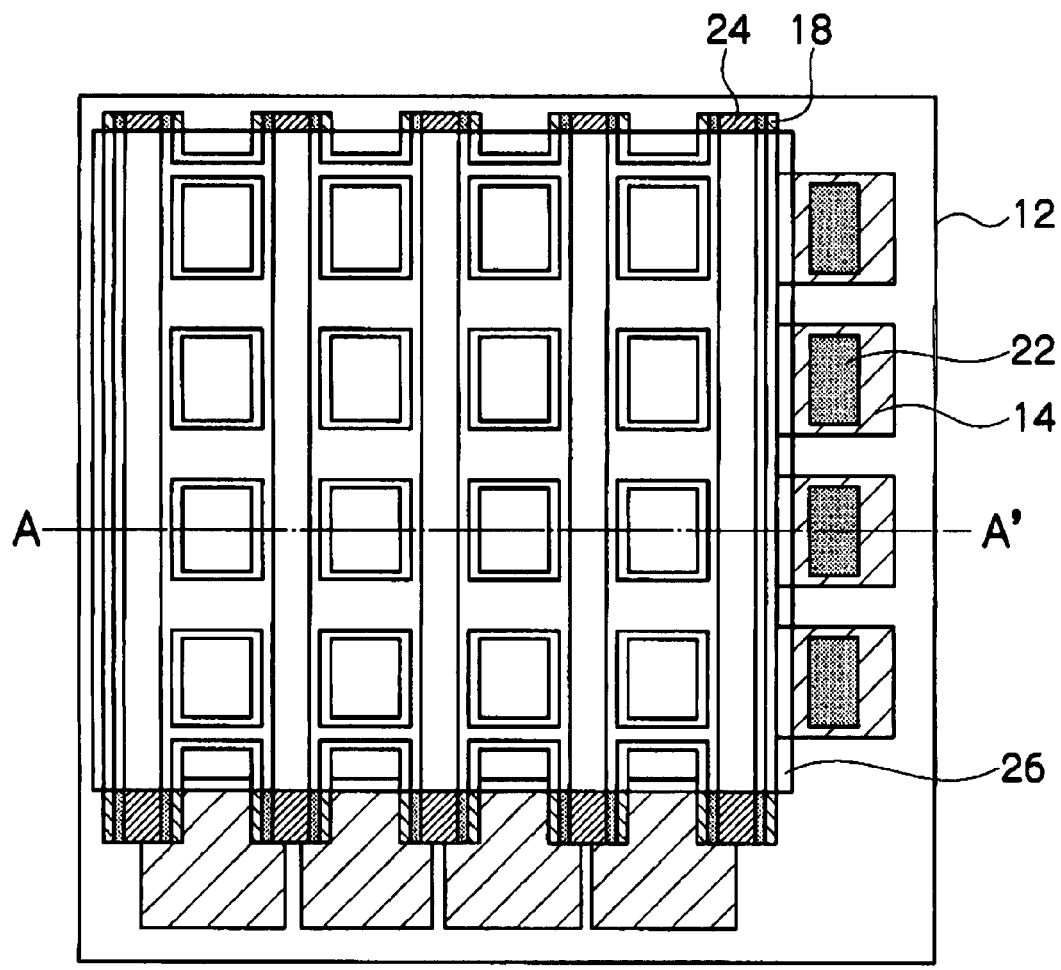
FIG. 6A is a schematic plan view showing an example of the arrangement of the organic EL layer.
Figure 6B:
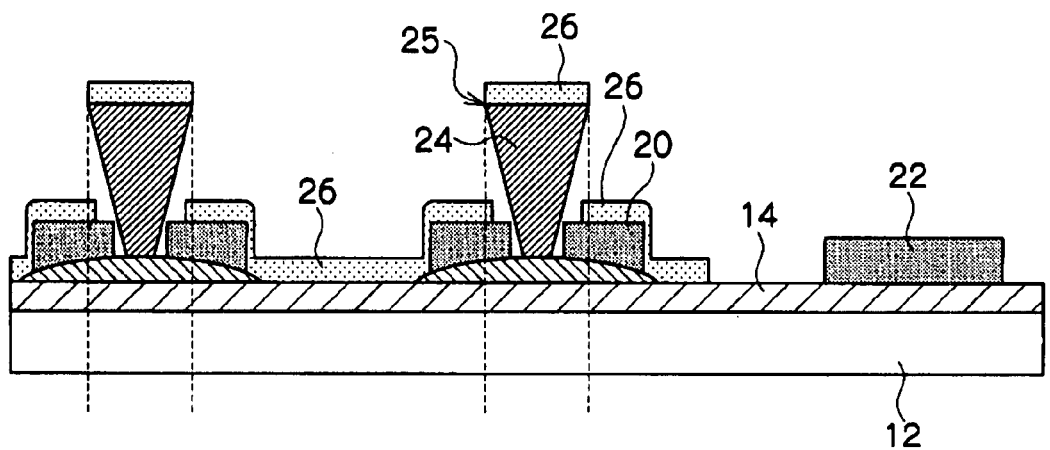
FIG. 6B is a partial cross-sectional view along the A-A' line of the panel as shown in FIG. 6A.

After forming the insulating barrier wall 24, the organic EL layer 26 is formed. FIGS. 6A and 6B schematically show the state where the organic EL layer 26 is formed. In an aspect of the invention, at least a part of the organic EL layer 26 can be formed by a resistance heating vacuum deposition method with the use of a solid mask. For example, by a resistance heating vacuum deposition method with the use of a solid mask, a hole transportation layer, a light emitting layer, and an electron transportation layer are formed sequentially. On this occasion, such accurate alignment as in the mask deposition with the use of a stripe mask or a pixel-by-pixel mask is not required, therefore the organic EL layer can be formed easily. By forming respective layers in this way by a resistance heating vacuum deposition method with the use of a solid mask without the use of a strip mask or a pixel-by-pixel mask, as shown in FIG. 6B, the organic EL layer 26 can be formed approximately uniformly on the lower electrode (anode) 14, the insulating barrier wall 24 and the auxiliary electrode 20 for the upper electrode. But, since a part of the upper face of the auxiliary electrode 20 for the upper electrode is hidden under the broadest portion 25 of the insulating barrier wall 24, almost no organic EL layer 26 is formed on portions inside the portion 25 and the auxiliary electrode 20 for the upper electrode is in an exposed state.

Examples of the material for use in the hole transportation layer include, but are not limited to, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalkone derivatives, styrylanthracene derivatives, fluorenone derivatives, hydrazone derivatives, stilbene derivatives, silazane derivatives, aromatic tertiary amine compounds, styrylamine compounds, aromatic dimethylidine-based compounds, porphyrin-based compounds, organic silane derivatives, carbon, and various types of metal complexes as represented by Ir complex having phenylazole or phenylazine as a ligand.

The light emitting layer may be constituted of a light emitting material alone, or have such constitution as a mixed layer of a host material and a light emitting material. The light emitting material may be a fluorescence light emitting material, or a phosphorescence light emitting material. One type, or two or more types of dopants may be used. The host material is preferably a charge transporting material. One type, or two or more types of host materials may be used. For example, a constitution, in which an electron transporting host material and a hole transporting host material are mixed, can be mentioned.

Examples of the host material to be incorporated in the light emitting layer include, but are not limited to, such compounds as having a carbazole skeleton, a diarylamine skeleton, a pyridine skeleton, a pyrazine skeleton, a triazine skeleton or an arylsilane skeleton, and materials as exemplified for the above-mentioned hole transportation layer and an under-mentioned electron transportation layer.

Examples of the material for use in the electron transportation layer include, but are not limited to, triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidene methane derivatives, distyrylpyrazine derivatives, aromatic tetracarboxylic anhydrides such as naphthalene tetracarboxylic anhydride and perylene tetracarboxylic anhydride, phthalocyanine derivatives, various types of metal complexes as represented by metal complex of 8-quinolinol derivatives, metal phthalocyanine, and metal complex including benzoxazole or benzothiazole as a ligand, and organic silane derivatives.

<Upper Transparent Electrode>

After forming the organic EL layer 26, upper transparent electrodes 28 in stripes are formed in a direction intersecting with plural lower electrodes 14 in stripes. For a method for forming the upper transparent electrode 28, a sputter deposition method is preferred. Argon ion beams are irradiated to a target composed of a material for constituting the upper transparent electrode 28 to form a film on the organic EL layer 26. For the material for the upper transparent electrode 28, ITO is preferred in the viewpoints of electroconductivity, transparency etc. The film formation by a sputtering deposition method gives a better coverage as compared with a resistance heating vacuum deposition method, and the material discharged from the target accumulates while turning around also to the under side of the broadest portion 25 of the insulating barrier wall 24. Accordingly, the upper transparent electrode 28 is formed even on portions of the auxiliary electrode 20 for the upper electrode where no organic EL layer 26 has been formed. As a result, the upper electrode 28 and the auxiliary electrode 20 for the upper transparent electrode can be connected with each other at a position between the portion 25 where the width of the insulating barrier wall 24 is broadest and the insulating layer 18, and inside the portion 25 where the width of the insulating barrier wall 24 is broadest (i.e. connected nearer to the center portion of the insulating barrier wall 24 than the boundaries of the region 25).

<Sealing Member>

After forming the upper transparent electrode, in order to prevent the degradation of the organic EL element by moisture and oxygen, the organic EL element is covered with a sealing member (protective layer) according to need. For the sealing member, for example, glass, plastic etc. can be employed.

By forming the organic EL display panel 10 according to the above-described steps, even when the insulating layer 18 and the auxiliary electrode 20 are formed slimly (narrowly), it is possible to assure the contact between the upper transparent electrode 28 and the auxiliary electrode 20 thereof under the portion 25 where the width of the insulating barrier wall 24 is broadest, therefore the voltage drop of the upper transparent electrode 28 can be inhibited with the aid of the auxiliary electrode 20. In addition, the organic EL layer 26 arranged between the lower electrode 14 and the upper transparent electrode 28 works as pixels, and respective pixels have a rectangular figure as can be seen in FIG. 1A. Accordingly, the organic EL display panel 10 having been produced as described above has a high opening ratio, and organic EL display devices equipped with such organic EL display panel 10 can display images with high brightness and high fineness.

Figure 7:
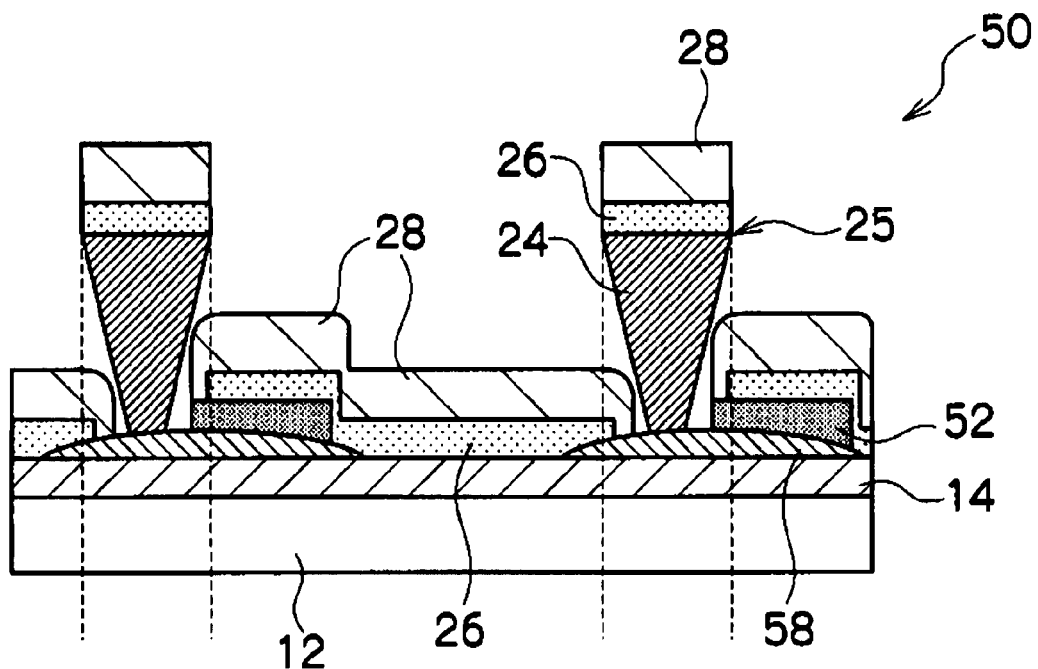
FIG. 7 is a schematic partial cross-sectional view showing another example of the organic EL display panel according to an aspect of the invention.

FIG. 7 shows another embodiment of the organic EL display panel according to an aspect of the invention. In this organic EL display panel 50, the insulating barrier wall 24 and an auxiliary electrode 52 for the upper electrode are so formed that each of them is separated right and left on an insulating layer 58. And, the organic EL layer 26 and the upper electrode (cathode) 28 are sequentially formed on the lower electrode (anode) 14 and the auxiliary electrode 52. Again, the upper electrode 28 and the auxiliary electrode 52 for the upper electrode are connected with each other at the position between the portion 25 where the width of the insulating barrier wall 24 is broadest and the insulating layer 58, and inside the portion 25 where the width of the insulating barrier wall 24 is broadest. In other words, even an organic EL display panel 50 having a constitution as shown in FIG. 7 can assure the connection between the upper transparent electrode 28 and the auxiliary electrode 52 thereof under the portion 25 where the width of the insulating barrier wall 24 is broadest. Therefore, the insulating layer 58 and the auxiliary electrode 52 can be formed slimly to give a high opening ratio.

Figure 8:
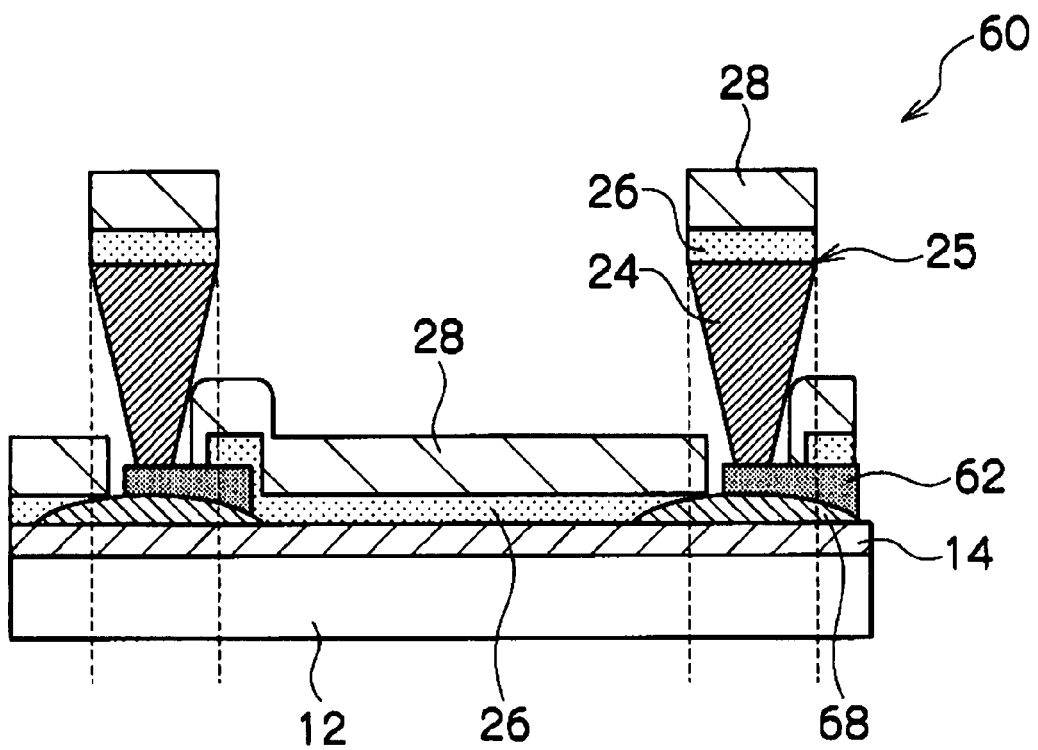
FIG. 8 is a schematic partial cross-sectional view showing further another example of the organic EL display panel according to an aspect of the invention.
Figure 9:
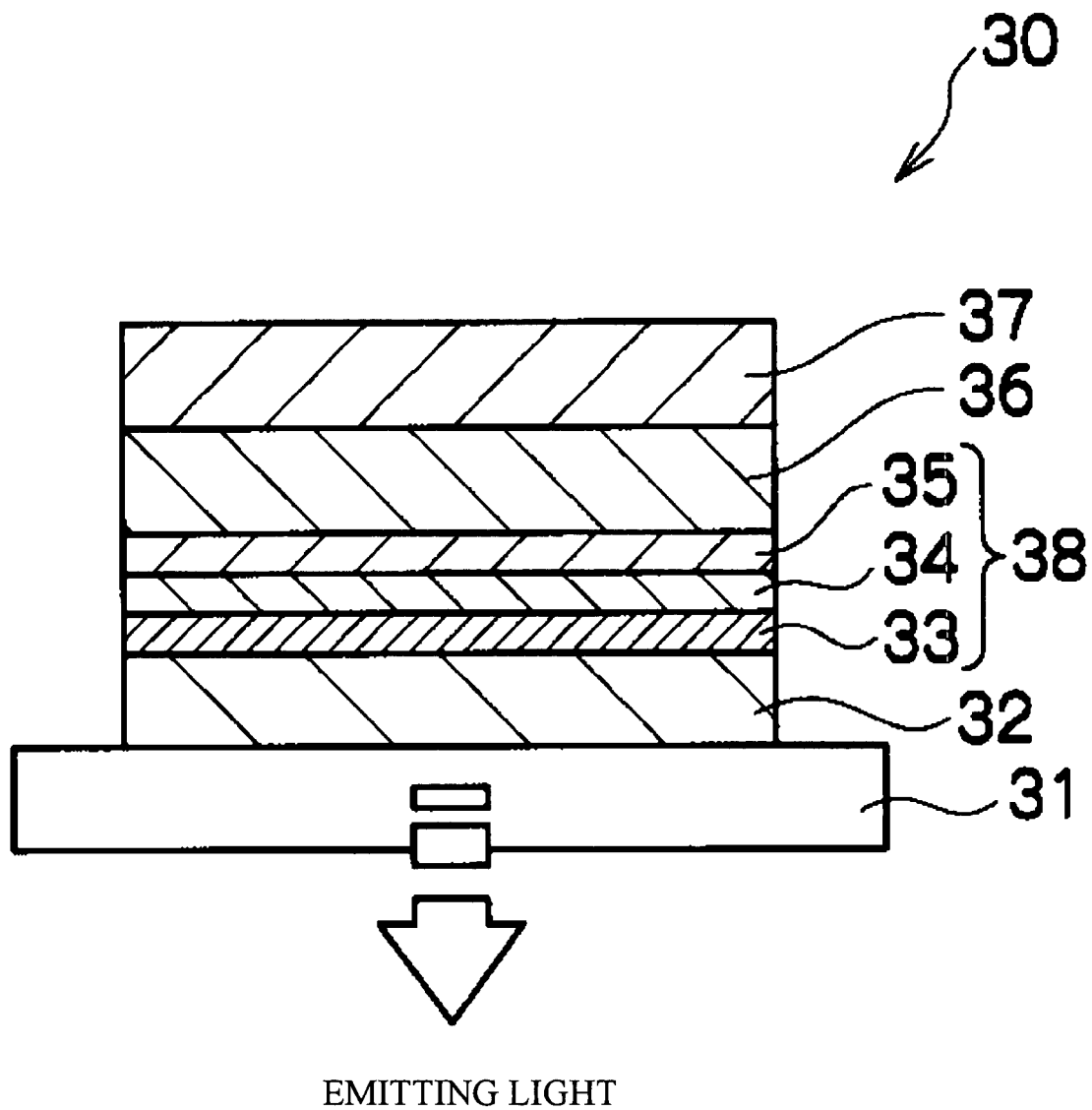
FIG. 9 is a schematic cross-sectional view showing an example of the constitution of the organic EL display panel.
Figure 10:
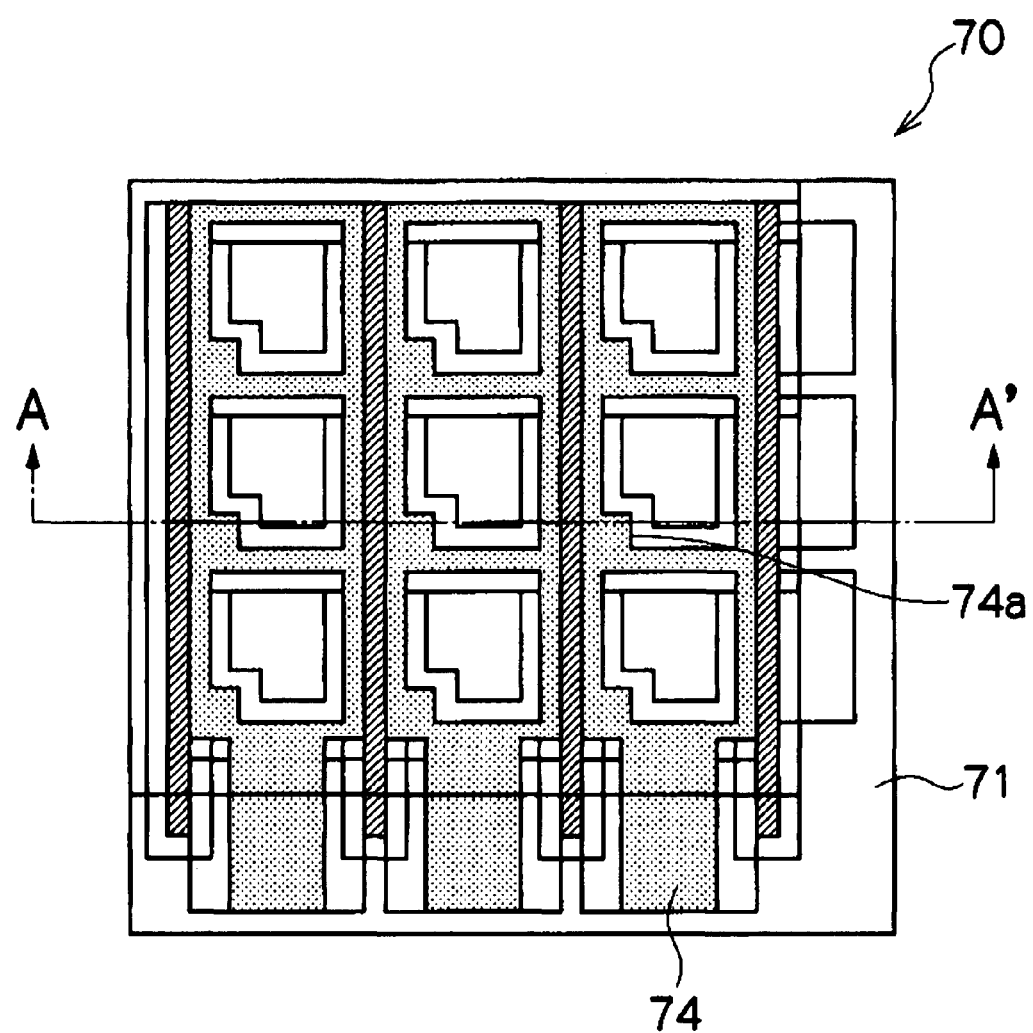
FIG. 10 is a schematic plan view showing an example of the constitution of an organic EL display panel of the related art equipped with an electrode auxiliary to the upper electrode.
Figure 11:
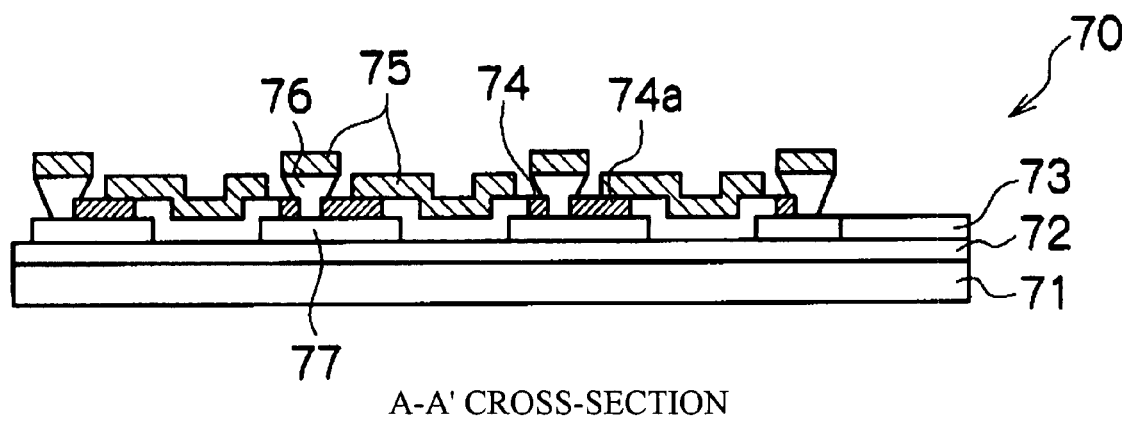
FIG. 11 is a schematic cross-sectional view showing the cross-section along the A-A' in FIG. 10.

FIG. 8 shows further another embodiment of the organic EL display panel according to an aspect of the invention. In an organic EL display panel 60, an auxiliary electrode 62 for the upper electrode is formed on an insulating layer 68, and further, on the auxiliary electrode 62 for the upper electrode, the insulating barrier wall 24 is formed. Then, on the lower electrode (anode) 14 and the auxiliary electrode 62, the organic EL layer 26 and the upper transparent electrode (cathode) 28 are sequentially formed. In this case also, the upper electrode 28 and the auxiliary electrode 62 for the upper electrode are connected with each other at the position between the portion 25 where the width of the insulating barrier wall 24 is broadest and the insulating layer 68, and inside the portion 25 where the width of the insulating barrier wall 24 is broadest. In addition, in the organic EL display panel 60, the insulating barrier wall 24 is formed on the auxiliary electrode 62, therefore the insulating layer 68 can be formed further slimily to give a more higher opening ratio.

As described above, in the organic EL display panel according to an aspect of the invention, the upper transparent electrode and the auxiliary electrode thereof are connected with each other at the position inside the portion where the width of the insulating barrier wall is broadest to give a high opening ratio. Therefore, organic EL display devices equipped with such organic EL display panel can display images with high brightness and high fineness. Further, according to an aspect of the invention, when forming the organic EL layer, since there is no necessity for using a stripe mask or a pixel-by-pixel mask and, therefore, an alignment mechanism with high accuracy, the organic EL layer and the electrode auxiliary to the upper electrode can be formed easily. Further, the electrode auxiliary to the upper electrode (cathode) is previously formed on the substrate side, therefore there is no necessity for forming an auxiliary wiring after forming the upper electrode (cathode). For example, it is also possible to simultaneously form the electrode auxiliary to the upper electrode (cathode) in the step for forming the electrode auxiliary to the lower electrode (anode) and the extraction electrode. Consequently, it is possible to provide organic EL display devices that are produced easily, consume low electric power, and have high brightness.

Heretofore, the invention has been described, but the invention is not limited to the above-described embodiments. For example, for the shape of the insulating barrier wall, it is not limited to the inversely tapered shape as shown in FIG. 5B etc. in which the width is broadened continuously toward the upper portion, as long as the width of the upper portion is broadened. A shape in which the width is broadened stepwise toward the upper portion or a shape of so-called overhang may be usable.

Further, the instance where the upper electrode is a cathode was described, but the invention can be applied, for example, to an instance of a top emission type organic EL display device where an anode is used for the upper electrode.

According to the invention, there are provided an organic EL display device that is equipped with an upper transparent electrode and an auxiliary electrode thereof, has a high opening ratio, and further can be produced easily; and a method for producing the same.

Hereinafter, embodiments of the invention will be described. However, the invention is not limited to these embodiments.

[1] An organic electroluminescent display device comprising:
a substrate;
lower electrodes arranged in stripes on the substrate;
an insulating layer arranged on the lower electrodes;
upper transparent electrodes arranged in stripes in a direction intersecting with the lower electrodes;
an organic electroluminescent layer arranged between the lower electrodes and the upper transparent electrodes;
electrodes auxiliary to the upper electrodes arranged on the insulating layer and connected with the upper transparent electrodes; and
insulating barrier walls arranged on the insulating layer or the electrodes auxiliary to the upper electrodes, the widths of the insulating barrier walls being broadened toward upper portions thereof;
wherein the upper electrodes are connected to the electrodes auxiliary to the upper electrodes at a position between the insulating layer and a region where the widths of the insulating barrier walls are broadest, and are connected within the region corresponding to the broadest width of the insulating barrier wall.

[2] The organic electroluminescent display device according to [1], wherein the electrodes auxiliary to the upper electrodes are formed so as to be separated by the insulating barrier walls.

[3] The organic electroluminescent display device according to [1], comprising extraction electrodes that transmit a signal from an external driving circuit to the lower electrodes and the upper transparent electrodes, wherein the extraction electrodes comprise the same material as the electrodes auxiliary to the upper electrodes.

[4] The organic electroluminescent display device according to [1], comprising electrodes auxiliary to the lower electrodes that are connected to the lower electrodes, wherein the electrodes auxiliary to the lower electrodes comprise the same material as the electrodes auxiliary to the upper electrodes.

[5] The organic electroluminescent display device according to [1], wherein the upper transparent electrodes comprise ITO (Indium Tin Oxide).

[6] The organic electroluminescent display device according to [5], wherein the auxiliary electrodes to the upper electrodes comprise at least one selected from the group consisting of Mo, Cr and Ti.

[7] The organic electroluminescent display device according to [1], wherein the lower electrodes are transparent electrodes.

[8] A method for producing the organic electroluminescent display device as described in [1], comprising sequentially forming the lower electrodes, the insulating layer, the electrodes auxiliary to the upper electrodes, the insulating barrier walls, the organic electroluminescent layer, and the upper transparent electrodes, wherein the upper transparent electrodes are formed by a sputtering method.

[9] The method for producing the organic electroluminescent display device according to [8], wherein at least a part of the organic electroluminescent layer is formed by resistance heating vacuum deposition using a solid mask.

[10] The method for producing the organic electroluminescent display device according to [8], wherein the electrodes auxiliary to the upper electrodes are formed to be separated by the insulating barrier walls.

[11] The method for producing the organic electroluminescent display device according to [8], wherein the organic electroluminescent display device comprises extraction electrodes that transmits a signal from an external driving circuit to the lower electrodes and the upper transparent electrodes, and the extraction electrodes comprise the same material as the electrodes auxiliary to the upper electrodes.

[12] The method for producing the organic electroluminescent display device according to [8], wherein the organic electroluminescent display device comprises electrodes auxiliary to the lower electrodes that are connected to the lower electrodes, and the electrodes auxiliary to the lower electrodes comprise the same material as the electrodes auxiliary to the upper electrodes.

[13] The method for producing the organic electroluminescent display device according to [8], wherein the upper transparent electrodes comprise ITO.

[14] The method for producing the organic electroluminescent display device according to [13], wherein the electrodes auxiliary to the upper electrodes comprise at least one selected from the group consisting of Mo, Cr and Ti.

[15] The method for producing the organic electroluminescent display device according to [8], wherein the lower electrodes are transparent electrodes.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent display device comprising:
a substrate;
lower electrodes arranged in stripes on the substrate;
an insulating layer arranged on the lower electrodes;
upper transparent electrodes arranged in stripes in a direction intersecting with the lower electrodes;
an organic electroluminescent layer arranged between the lower electrodes and the upper transparent electrodes;
electrodes auxiliary to the upper electrodes arranged on the insulating layer and connected with the upper transparent electrodes; and insulating barrier walls arranged on the insulating layer or the electrodes auxiliary to the upper electrodes, the widths of the insulating barrier walls being broadened toward upper portions thereof;

wherein the upper electrodes are connected to the electrodes auxiliary to the upper electrodes at a position between the insulating layer and a region where the widths of the insulating barrier walls are broadest, and are connected within the region corresponding to the broadest width of the insulating barrier wall.

2. The organic electroluminescent display device according to claim 1, wherein the electrodes auxiliary to the upper electrodes are formed so as to be separated by the insulating barrier walls.

3. The organic electroluminescent display device according to claim 1, comprising extraction electrodes that transmit a signal from an external driving circuit to the lower electrodes and the upper transparent electrodes, wherein the extraction electrodes comprise the same material as the electrodes auxiliary to the upper electrodes.

4. The organic electroluminescent display device according to claim 1, comprising electrodes auxiliary to the lower electrodes that are connected to the lower electrodes, wherein the electrodes auxiliary to the lower electrodes comprise the same material as the electrodes auxiliary to the upper electrodes.

5. The organic electroluminescent display device according to claim 1, wherein the upper transparent electrodes comprise ITO (Indium Tin Oxide).

6. The organic electroluminescent display device according to claim 5, wherein the auxiliary electrodes to the upper electrodes comprise at least one selected from the group consisting of Mo, Cr and Ti.

7. The organic electroluminescent display device according to claim 1, wherein the lower electrodes are transparent electrodes.

* * * * *